(12) United States Patent
Lee et al.

(10) Patent No.: US 12,273,992 B2
(45) Date of Patent: Apr. 8, 2025

(54) FLEXIBLE PRINTED CIRCUIT BOARD AND ELECTRONIC DEVICE INCLUDING THE SAME

(71) Applicant: Samsung Electronics Co., Ltd., Suwon-si (KR)

(72) Inventors: Youngsun Lee, Suwon-si (KR); Jongmin Jeon, Suwon-si (KR); Hyunsuk Kim, Suwon-si (KR); Kyuwon Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 352 days.

(21) Appl. No.: 17/861,630

(22) Filed: Jul. 11, 2022

(65) Prior Publication Data

US 2022/0346224 A1 Oct. 27, 2022

Related U.S. Application Data

(63) Continuation of application No. PCT/KR2021/008952, filed on Jul. 13, 2021.

(30) Foreign Application Priority Data

Jul. 22, 2020 (KR) ........................ 10-2020-0091056

(51) Int. Cl.
*H05K 1/02* (2006.01)
*H05K 5/00* (2006.01)
*H05K 5/02* (2006.01)

(52) U.S. Cl.
CPC ......... *H05K 1/0277* (2013.01); *H05K 1/0216* (2013.01); *H05K 5/0017* (2013.01); *H05K 5/0226* (2013.01); *H05K 2201/056* (2013.01)

(58) Field of Classification Search
CPC .. H05K 1/0277; H05K 1/0216; H05K 5/0017; H05K 5/0226; H05K 2201/056
(Continued)

(56) References Cited

U.S. PATENT DOCUMENTS

2004/0253972 A1* 12/2004 Iwai ........................ H01Q 9/30
455/90.3
2005/0190531 A1 9/2005 Gall et al.
(Continued)

FOREIGN PATENT DOCUMENTS

JP 5274564 B2 8/2013
JP 6360792 B2 7/2018
(Continued)

OTHER PUBLICATIONS

International Search Report with English translation and Written Opinion dated Nov. 1, 2021; International Application No. PCT/KR2021/008952.

*Primary Examiner* — Binh B Tran
(74) *Attorney, Agent, or Firm* — Jefferson IP Law, LLP

(57) ABSTRACT

A flexible printed circuit board (FPCB) of an electronic device including a flexible display having a shape deformed by a hinge structure is provided. The FPCB of an electronic device includes a plurality of bending portions and a plurality of non-bending portions. The plurality of bending portions is bent according to a deformation of a shape of the electronic device. The plurality of non-bending portions are positioned on a periphery of the plurality of bending portions. The plurality of bending portions and the plurality of non-bending portions are formed to have different thicknesses.

20 Claims, 19 Drawing Sheets

(58) Field of Classification Search
USPC .......................................................... 361/749
See application file for complete search history.

(56) References Cited

U.S. PATENT DOCUMENTS

| | | | |
|---|---|---|---|
| 2011/0139493 A1 | 6/2011 | Sumida et al. | |
| 2015/0189740 A1 | 7/2015 | Kido et al. | |
| 2020/0060020 A1 | 2/2020 | Park et al. | |
| 2021/0135492 A1 | 5/2021 | Kim et al. | |
| 2021/0360780 A1* | 11/2021 | Kim | H05K 1/0213 |
| 2021/0360814 A1 | 11/2021 | Hong | |
| 2022/0321683 A1* | 10/2022 | Luo | H04M 1/0274 |

FOREIGN PATENT DOCUMENTS

| | | |
|---|---|---|
| KR | 10-2016-0065627 A | 6/2016 |
| KR | 10-2016-0124344 A | 10/2016 |
| KR | 10-2019-0115888 A | 10/2019 |
| KR | 10-2020-0021172 A | 2/2020 |
| KR | 10-2020-0023024 A | 3/2020 |
| KR | 10-2020-0048238 A | 5/2020 |

\* cited by examiner

FLEXIBLE PRINTED CIRCUIT BOARD AND ELECTRONIC DEVICE INCLUDING THE SAME

CROSS-REFERENCE TO RELATED APPLICATION(S)

This application is a continuation application, claiming priority under § 365(c), of an International application No. PCT/KR2021/008952, filed on Jul. 13, 2021, which is based on and claims the benefit of a Korean patent application number 10-2020-0091056, filed on Jul. 22, 2020, in the Korean Intellectual Property Office, the disclosure of which is incorporated by reference herein in its entirety.

TECHNICAL FIELD

The disclosure relates to a flexible printed circuit board (FPCB) (for example, a foldable flat radio frequency (RF) cable (FRC)) and an electronic device including the same.

BACKGROUND ART

In recent years, electronic devices such as mobile electronic devices are developing in pursuit of thin thickness, lightness, miniaturization, and multi-functionality, and, to achieve these, an electronic device may include a printed circuit board (PCB) (for example, a printed board assembly (PBA), a rigid-flexible PCB (RFPCB), a flexible PCB, and/or a flat RF cable) having various components mounted thereon.

Foldable electronic devices or slidable electronic devices capable of extending displays are developing in recent years. A foldable electronic device is configured to have a flexible display folded or unfolded, and a slidable electronic device is configured to have a flexible display move in a sliding manner and to have a screen extended or reduced. When the foldable electronic device is folded, an FPCB (for example, an FRC) is folded and unfolded in a folding region where the display is folded, and there may be a problem that the FPCB is damaged due to repetitive folding and unfolding. The slidable electronic device has the screen extended when sliding open, and has the screen reduced when sliding close. When the screen of the slidable electronic device is extended and reduced, an FPCB (for example, an FRC) is folded or unfolded in a hinge structure region, and there may be a problem that the FPCB is damaged due to repetitive folding and unfolding.

The above information is presented as background information only, and to assist with an understanding of the disclosure. No determination has been made, and no assertion is made, as to whether any of the above might be applicable as prior art with regard to the disclosure.

DISCLOSURE

Technical Problem

Accordingly, an aspect of the disclosure is to provide a flexible printed circuit board (FPCB) (for example, a foldable flat radio frequency (RF) cable (FRC)) which is not damaged in spite of repetitive folding and unfolding of a foldable electronic device and can maintain a long lifespan, and an electronic device including the same.

Aspects of the disclosure are to address at least the above-mentioned problems and/or disadvantages and to provide at least the advantages described below.

Another aspect of the disclosure is to provide an FPCB (for example, an FRC) which is not damaged in spite of repetitive extension and reduction of a screen of a slidable electronic device, and can maintain a long lifespan, and an electronic device including the same.

The technical problems to be achieved in the disclosure are not limited to the technical problems mentioned above, and other technical problems not mentioned can be clearly understood by those of ordinary skill in the art to which the disclosure belongs from the description below.

Technical Solution

In accordance with an aspect of the disclosure, an FPCB of an electronic device including a flexible display having a shape deformed by a hinge structure is provided. The FPCB includes a plurality of bending portions and a plurality of non-bending portions. The plurality of bending portions may be bent according to a deformation of a shape of the electronic device. The plurality of non-bending portions may be positioned on a periphery of the plurality of bending portions. The plurality of bending portions and the plurality of non-bending portions may be formed to have different thicknesses.

In accordance with another aspect of the disclosure, an electronic device is provided. The electronic device includes a hinge structure, a flexible display having a shape deformed by the hinge structure, and an FPCB. The FPCB may include a plurality of bending portions which are bent according to a deformation of a shape of the electronic device, and a plurality of non-bending portions which are positioned on a periphery of the plurality of bending portions. The plurality of bending portions and the plurality of non-bending portions may be formed to have different thicknesses.

Other aspects, advantages, and salient features of the disclosure will become apparent to those skilled in the art from the following detailed description, which, taken in conjunction with the annexed drawings, discloses various embodiments of the disclosure.

Advantageous Effects

According to various embodiments of the disclosure, an FPCB (for example, an FRC) which is not damaged by repetitive folding and unfolding of a foldable electronic device, and can maintain a long lifespan, and an electronic device including the same are provided. In addition, an FPCB (for example, an FRC) which is not damaged by repetitive extension and reduction of a screen of a slidable electronic device, and can maintain a long lifespan, and an electronic device including the same are provided.

Various other effects that can be directly or indirectly understood through the disclosure may be provided.

DESCRIPTION OF DRAWINGS

The same reference numerals are used to represent the same elements throughout the drawings.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
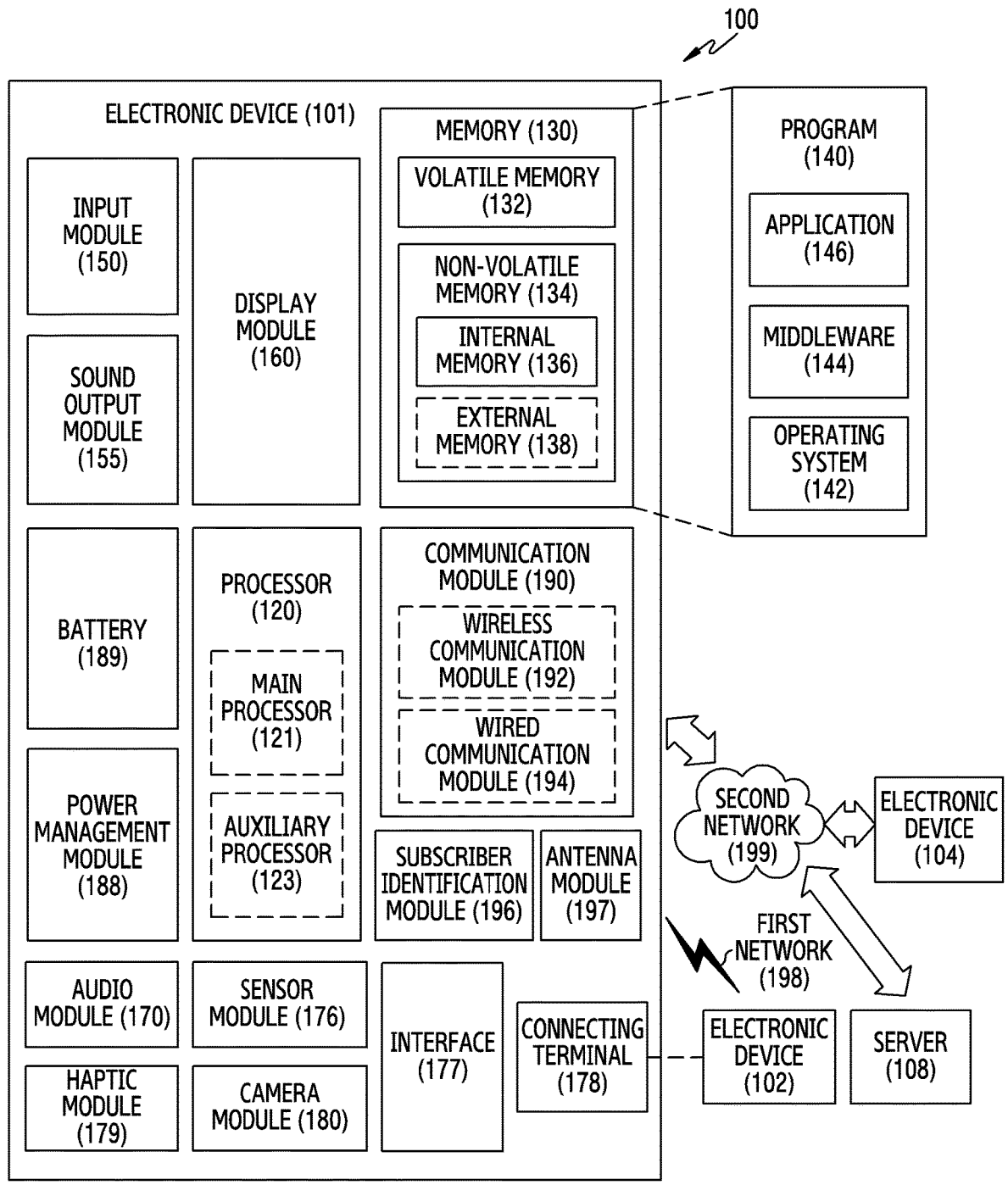
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 or an external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101.

The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, WiFi direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4th generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large-scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

Figure 2:
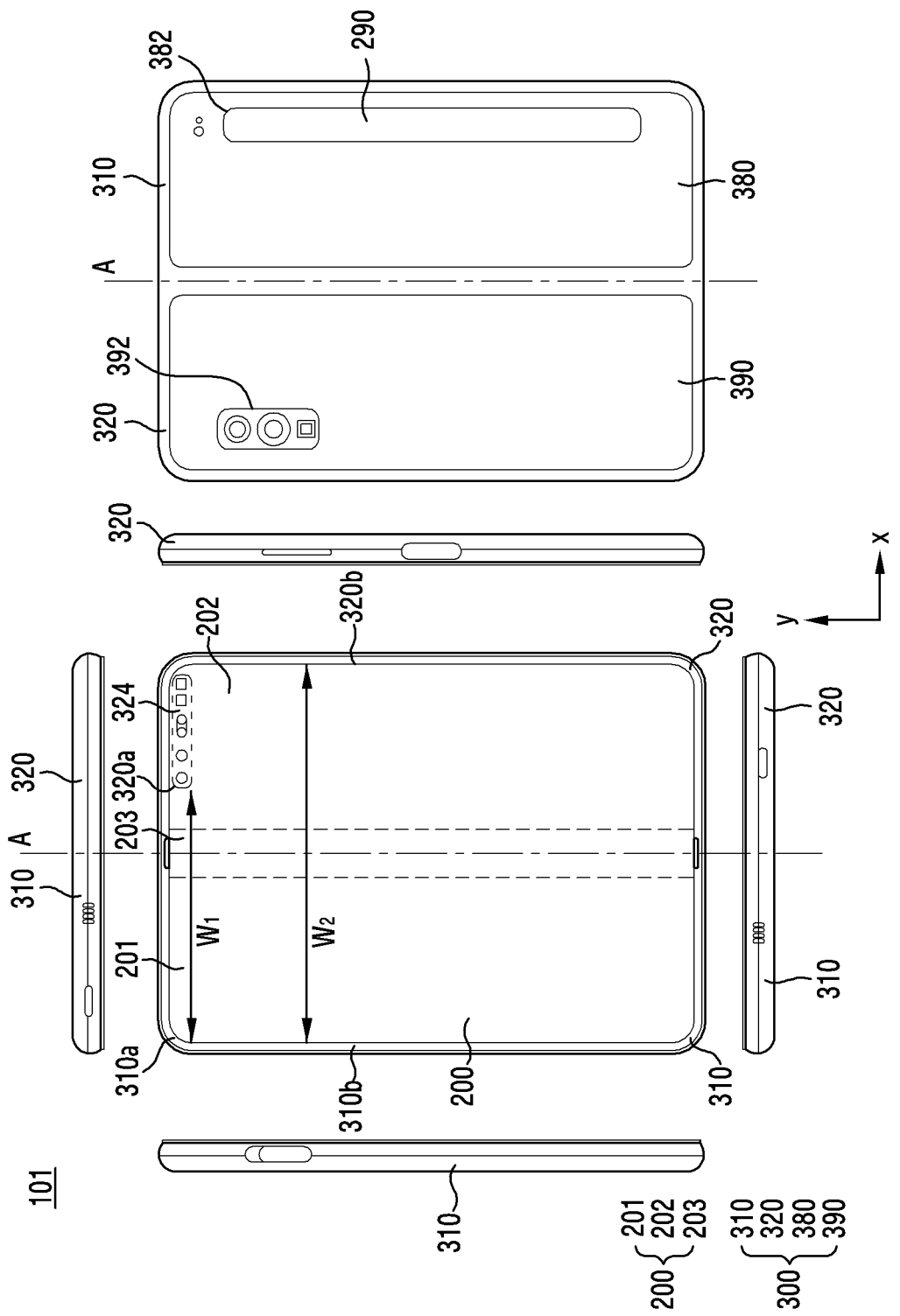
FIG. 2 is a view illustrating a flat state of an electronic device according to an embodiment of the disclosure.

FIG. 2 is a view illustrating a flat state of an electronic device according to an embodiment of the disclosure.

Figure 3:
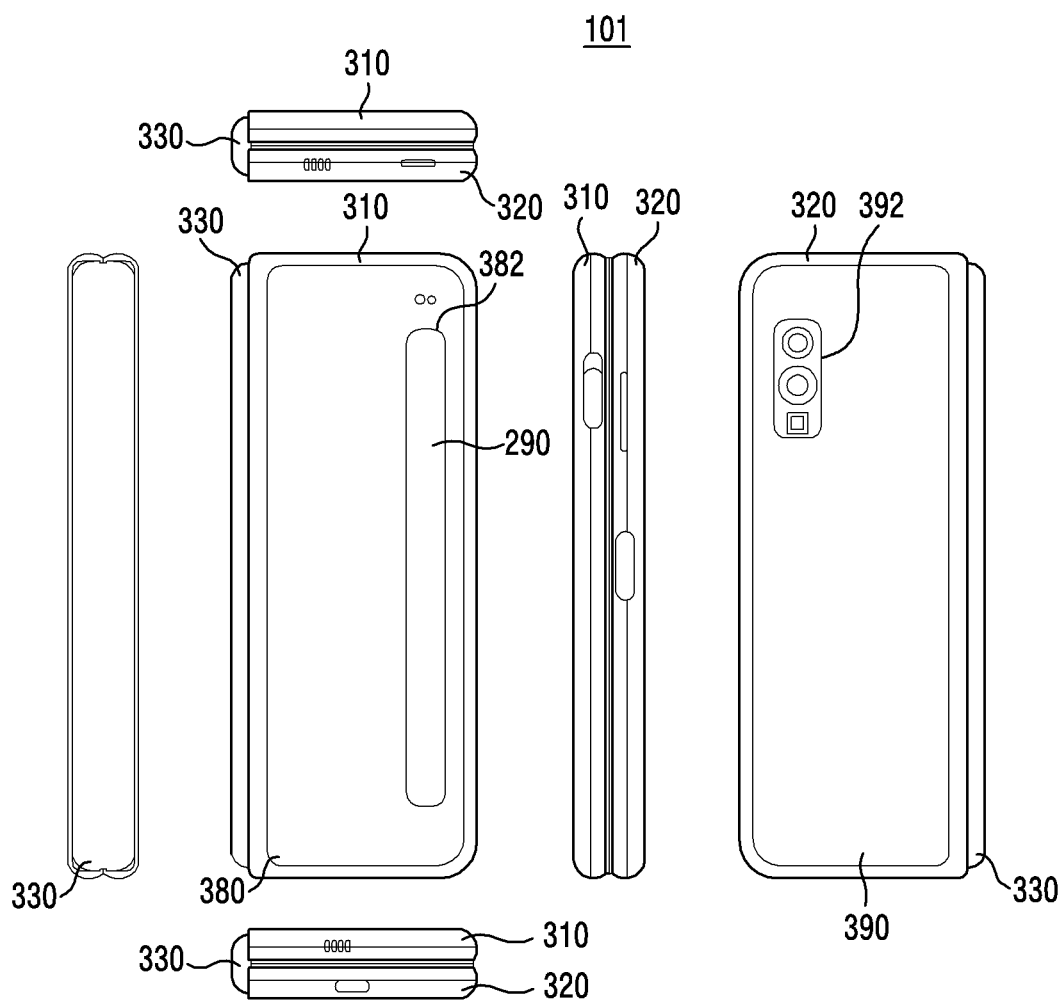
FIG. 3 is a view illustrating a folded state of an electronic device according to an embodiment of the disclosure.

FIG. 3 is a view illustrating a folded state of an electronic device according to an embodiment of the disclosure.

Referring to FIGS. 2 and 3, the electronic device 101 of FIG. 1 may include a foldable housing 300, a hinge cover 330 which covers a foldable portion of the foldable housing 300, and a flexible or foldable display 200 (hereinafter, referred to as a "display" 200) disposed in a space formed by the foldable housing 300. In the disclosure, a surface on which the display 200 is disposed is defined as a first surface or a front surface of the electronic device 101. In addition, the opposite surface of the front surface is defined as a second surface or a rear surface of the electronic device 101. In addition, a surface surrounding a space between the front surface and the rear surface is defined as a third surface or a side surface of the electronic device 101. For example, the electronic device 101 may be folded or unfolded in an X-axis direction with reference to a folding region 203.

In an embodiment, the foldable housing 300 may include a first housing structure 310, a second housing structure 320 including a sensor region 324, a first rear surface cover 380, and a second rear surface cover 390. The foldable housing 300 of the electronic device 101 is not limited to the shape and coupling shown in FIGS. 2 and 3, and may be implemented by a combination and/or coupling of other shapes or components. For example, in another embodiment, the first housing structure 310 and the first rear surface cover 380 may be integrally formed with each other, and the second housing structure 320 and the second rear surface cover 390 may be integrally formed with each other.

In the illustrated embodiment, the first housing structure 310 and the second housing structure 320 may be disposed on both sides with reference to a folding axis (A axis), and may have a substantially symmetric shape with respect to the folding axis A. As will be described below, the first housing structure 310 and the second housing structure 320 may have a different angle or distance therebetween according to whether the electronic device 101 is in a flat state, a folded state, or an intermediate state. In the illustrated embodiment, the second housing structure 320 may additionally include the sensor region 324 in which various sensors are disposed, differently from the first housing structure 310, but may have a symmetric shape with the first housing structure 310 in the other regions.

In an embodiment, the first housing structure 310 and the second housing structure 320 may form a recess along with each other to receive the display 200. In the illustrated embodiment, due to the presence of the sensor region 324, the recess may have two different widths in a direction perpendicular to the folding axis A.

For example, the recess may have a first width W1 between a first portion 310a of the first housing structure 310 and a first portion 320a of the second housing structure 320 formed on a periphery of the sensor region 324 of the second housing structure 320. The recess may have a second width W2 which is formed by a second portion 310b of the first housing structure 310 that is parallel to the folding axis A of the first housing structure 310, and a second portion 320b of the second housing structure 320 that does not correspond to the sensor region 324 of the second housing structure 320 and is parallel to the folding axis A. In this case, the second width W2 may be longer than the first width W1. In other words, the first portion 310a of the first housing structure 310 and the first portion 320a of the second housing structure 320 that have an asymmetric shape may form the first width W1 of the recess. The second portion 310b of the first housing structure 310 and the second portion 320b of the second housing structure 320 that have a symmetric shape may form the second width W2 of the recess. In an embodiment, the first portion 320a and the second portion 320b of the second housing structure 320 may have different distances from the folding axis A. The width of the recess is not limited to the illustrated example. In various embodiments, the recess may have a plurality of widths according to a shape of the sensor region 324 or an asymmetric portion of the first housing structure 310 and the second housing structure 320.

In an example, at least a portion of the first housing structure 310 and the second housing structure 320 may be formed with a metallic material or a nonmetallic material having stiffness of a selected size to support the display 200.

In an embodiment, the sensor region 324 may be formed adjacent to one corner of the second housing structure 320 to have a predetermined region. The disposal, shape, and size of the sensor region 324 are not limited to the illustrated example. For example, in another embodiment, the sensor region 324 may be provided on another corner of the second housing structure 320 or on a certain region between an upper end corner or a lower end corner. In an embodiment, components embedded in the electronic device 101 to perform various functions may be exposed to the front surface of the electronic device 101 through the sensor region 324 or one or more openings provided in the sensor region 324. In various embodiments, the components may include various kinds of sensors. The sensors may include at least one of, for example, a front-facing camera, a receiver, or a proximity sensor.

The first rear surface cover 380 may be disposed at one side of the folding axis on the rear surface of the electronic device, and for example, may have a substantially rectangular periphery, and the periphery may be enclosed by the first housing structure 310. Similarly, the second rear surface cover 390 may be disposed at the other side of the folding axis on the rear surface of the electronic device, and may have its periphery enclosed by the second housing structure 320.

In the illustrated embodiment, the first rear surface cover 380 and the second rear surface cover 390 may have a substantially symmetric shape with reference to the folding axis (A axis). However, the first rear surface cover 380 and the second rear surface cover 390 may not necessarily have a symmetric shape, and in another embodiment, the electronic device 101 may include the first rear surface cover 380 and the second rear surface cover 390 having various shapes. In another embodiment, the first rear surface cover 380 may be integrally formed with the first housing structure 310, and the second rear surface cover 390 may be integrally formed with the second housing structure 320.

In an embodiment, the first rear surface cover 380, the second rear surface cover 390, the first housing structure 310, and the second housing structure 320 may form a space to have various components (for example, a PCB or a battery) disposed therein. In an embodiment, one or more components may be disposed on the rear surface of the electronic device 101 or may be visually exposed. For example, at least a portion of a sub display 290 may be visually exposed through a first rear surface region 382 of the first rear surface cover 380. In another embodiment, one or more components or sensors may be visually exposed through a second rear surface region 392 of the second rear surface cover 390. In various embodiments, the sensor may include a proximity sensor and/or a rear-facing camera.

The hinge cover 330 may be disposed between the first housing structure 310 and the second housing structure 320, and may be configured to hide inner components (for example, a hinge structure). In an embodiment, the hinge cover 330 may be hidden by a portion of the first housing structure 310 and the second housing structure 320, or may be exposed to the outside according to a state (flat state or folded state) of the electronic device 101.

For example, when the electronic device 101 is in the flat state as shown in FIG. 2, the hinge cover 330 may be hidden by the first housing structure 310 and the second housing structure 320 and may not be exposed to the outside. For example, when the electronic device 101 is in the folded state (for example, a fully folded state) as shown in FIG. 3, the hinge cover 330 may be exposed to the outside between the first housing structure 310 and the second housing structure 320. For example, when the first housing structure 310 and the second housing structure 320 is in an intermediate state to be folded with a certain angle, the hinge cover 330 may be exposed to the outside at least in part between the first housing structure 310 and the second housing structure 320. However, in this case, an exposed region may be smaller than in the fully folded state. In an embodiment, the hinge cover 330 may include a curved surface.

The display 220 may be disposed on a space formed by the foldable housing 300. For example, the display 200 may be seated on a recess formed by the foldable housing 300, and may form most of the front surface of the electronic device 101.

Accordingly, the front surface of the electronic device 101 may include the display 200, and some regions of the first housing structure 310 and some regions of the second housing structure 320 which are adjacent to the display 200. In addition, the rear surface of the electronic device 101 may include the first rear surface cover 380, some regions of the first housing structure 380 that are adjacent to the first rear surface cover 380, the second rear surface cover 390, and some regions of the second housing structure 320 that are adjacent to the second rear surface cover 390.

The display 200 may refer to a display that have at least some regions deformed to a flat surface or a curved surface. In an embodiment, the display 200 may include a folding region 203, a first region 201 disposed on one side with reference to the folding region 203 (for example, the left side of the folding region 203 shown in FIG. 2), and a second region 202 disposed on the other side (for example, the right side of the folding region 203 shown in FIG. 2). The display 200 may include a polarizing film (or a polarizing layer), window glass (for example, ultra-thin glass (UTG) or polymer window), and an optical compensation film (OCF).

Dividing the display 220 is an example and the display 200 may be divided into a plurality of regions (for example, four or more or two regions) according to a structure or function thereof. For example, in the embodiment illustrated in FIG. 2, the display 200 may be divided into regions by the folding region 203 extended in parallel to the y-axis, or the folding axis (A axis). In another embodiment, the display 200 may be divided into regions with reference to another folding region (for example, a folding region parallel to the x-axis) or another folding axis (for example, a folding axis parallel to the x-axis).

The first region 201 and the second region 202 may have a substantially symmetric shape with reference to the folding region 203. However, the second region 202 may include a notch that is cut according to the presence of the sensor region 324, differently from the first region 201, but may have a symmetric shape with the first region 201 on the other regions. In other words, the first region 201 and the second region 202 may have portions that are symmetric, and portions that are asymmetric.

Hereinafter, operations of the first housing structure 310 and the second housing structure 320 and respective regions of the display 200 according to a state (for example, a flat state and a folded state) of the electronic device 101 will be described.

In an embodiment, when the electronic device 101 is in a flat state (for example, FIG. 2), the first housing structure 310 and the second housing structure 320 may be disposed to face in the same direction, while forming an angle of 180 degrees. A surface of the first region 201 of the display 200 and a surface of the second region 202 may form 180 degrees with each other, and may face in the same direction (for example, a front-facing direction of the electronic device). The folding region 203 may be on the same plane as the first region 201 and the second region 202.

In an embodiment, when the electronic device 101 is in a folded state (for example, FIG. 3), the first housing structure 310 and the second housing structure 320 may be disposed to face each other. The surface of the first region 201 of the display 200 and the surface of the second region 202 may form a small angle (for example, between 0 degree and 10 degrees) with each other, and may face each other. The folding region 203 may have at least a portion formed with a curved surface having a predetermined curvature.

In an embodiment, when the electronic device 101 is in a half-folded state, the first housing structure 310 and the second housing structure 320 may be disposed with a certain angle. The surface of the first region 201 of the display 200 and the surface of the second region 202 may form an angle that is larger than in the folded state and is smaller than in the flat state. The folding region 203 may have at least a portion formed with a curved surface having a predetermined curvature, and the curvature in this case may be smaller than in the folded state.

Figure 4:
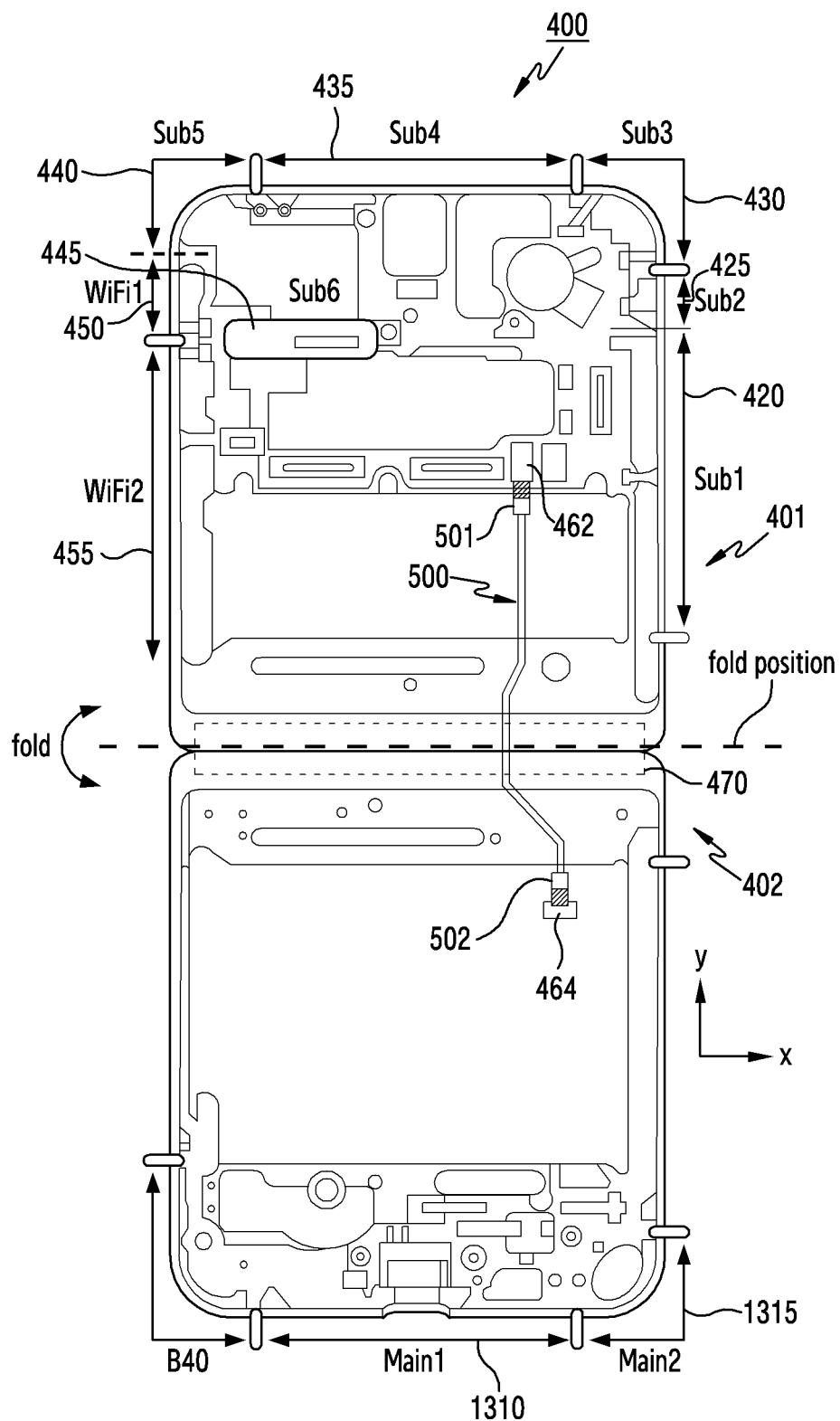
FIG. 4 is a view illustrating an electronic device according to an embodiment of the disclosure.

FIG. 4 is a view illustrating an electronic device (for example, the electronic device of FIG. 2) according to an embodiment of the disclosure.

Referring to FIG. 4, an electronic device 400 (for example, the electronic device 101 of FIG. 2) according to various embodiments may be a foldable device. The electronic device 400 (for example, the electronic device 101 of FIG. 2) may include a hinge structure 470 disposed on a fold position. For example, the electronic device 400 (for example, the electronic device 101 of FIG. 2) may be folded or unfolded in a Y-axis direction with reference to the fold position by using the hinge structure 470. When the electronic device 400 (for example, the electronic device 101 of FIG. 2) is folded, a first portion 401 and a second portion 402 of the electronic device 400 (for example, the electronic device 101 of FIG. 2) may approach while facing each other with reference the fold position.

In an embodiment, the electronic device 400 (for example, the electronic device 101 of FIG. 2) may include a modem (not shown), a transceiver (not shown), a plurality of front ends (not shown), a flexible printed circuit board (FPCB) 500 (for example, a flat radio frequency (RF) cable (FRC)) electrically connecting a first circuit board of the first portion 401 and a second circuit board of the second portion 402, and a plurality of antenna modules.

The plurality of antenna modules may include a first antenna module 1310 (a first main antenna module), a second antenna module 1315 (a second main antenna module), a third antenna module 420 (a first sub antenna module), a fourth antenna module 425 (for example, a second sub antenna module), a fifth antenna module 430 (for example, a third sub antenna module), a sixth antenna module 435 (for example, a fourth sub antenna module), a seventh antenna module 440 (for example, a fifth sub antenna module), an eighth antenna module 445 (for example, a sixth sub antenna module), a first WiFi antenna module 450, and a second WiFi antenna module 455. In an embodiment, the WiFi module may be a WiFi circuit for supporting WiFi communication, for example, but is not limited thereto. For example, a Bluetooth circuit for supporting Bluetooth communication may be included.

Figure 5:
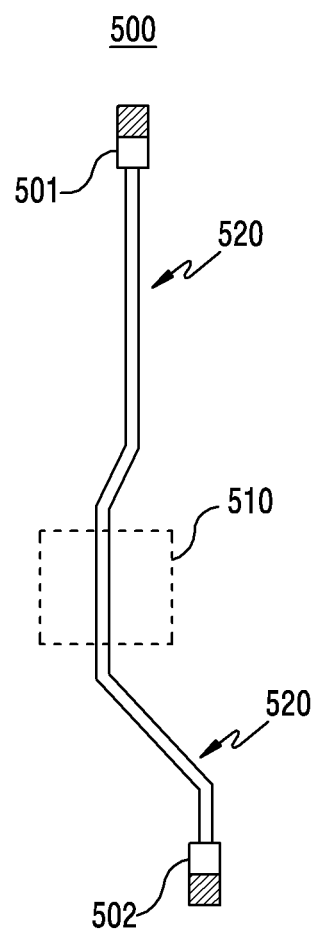
FIG. 5 is a view illustrating a flexible printed circuit board (FPCB) (for example, a foldable flat radio frequency (RF) cable (FRC)) according to an embodiment of the disclosure.

FIG. 5 is a view illustrating an FPCB (for example, a foldable FRC) according to an embodiment of the disclosure.

Referring to FIGS. 4 and 5, an FPCB 500 (for example, a foldable FRC) may include a first connector 501, a second connector 502, and wire units 510 and 520. The wire units 510 and 520 may include a bending portion 510 which is bent by folding and unfolding of the electronic device 400 (for example, the electronic device 101 of FIG. 2), and non-bending portions 520 which are not bent. For example, the bending portion 510 of the FPCB 500 (for example, a foldable FRC) may be formed to correspond to the fold position of the electronic device 400 (for example, the electronic device 101 of FIG. 2). The FPCB 500 (for example, a foldable FRC) may be formed to be about 70-90 μm thick, but embodiments are not limited thereto. Herein, the bending portion 510 and the non-bending portions 520 may be formed to have different thicknesses (see FIG. 9B).

The FPCB 500 (for example, a foldable FRC) may have the first connector 501 formed at a first side thereof to be connected with a connector 462 of the first circuit board, and may have the second connector 502 formed at a second side thereof to be connected with a connector 464 of the second circuit board. The first circuit board of the first portion 401 and the second circuit board of the second portion 402 may be electrically connected with each other by the FPCB 500 (for example, a foldable FRC), and a control signal and an RF signal may be transmitted and received between the first portion 401 and the second portion 402.

Figure 6A:
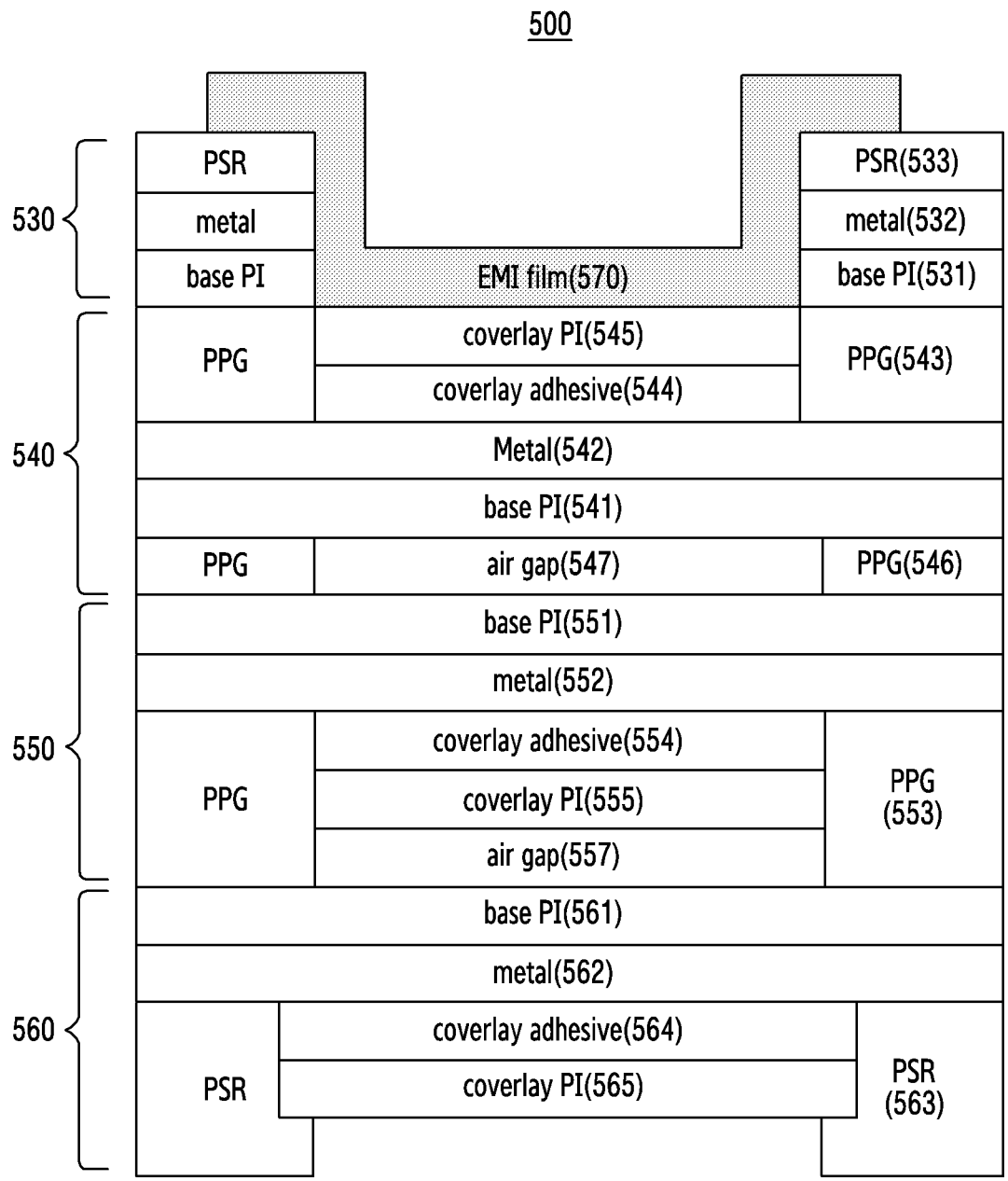
FIG. 6A is a view illustrating a cross-sectional structure of an FPCB (for example, a foldable FRC) shown in FIG. 5 according to an embodiment of the disclosure.

FIG. 6A is a view illustrating a cross-sectional structure of an FPCB (for example, a foldable FRC) shown in FIG. 5 according to an embodiment of the disclosure.

Figure 6B:
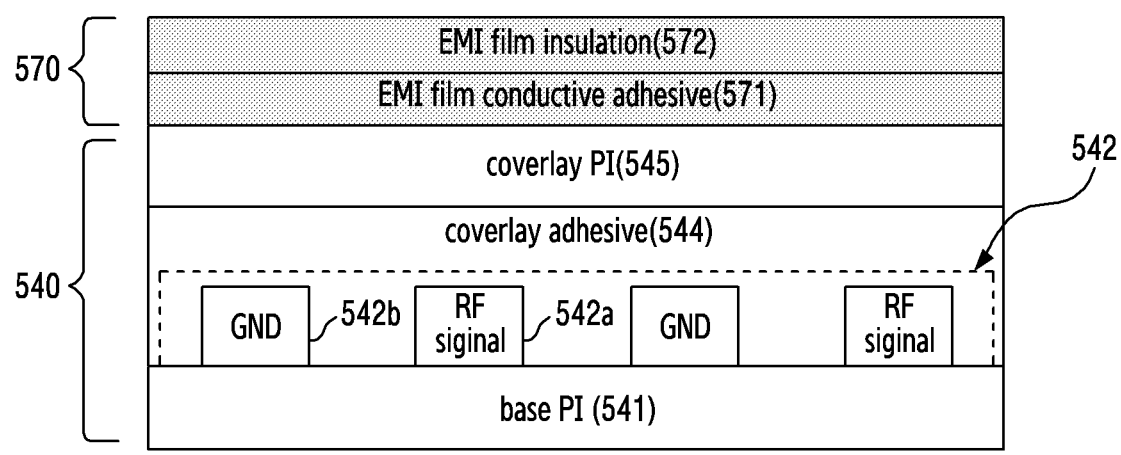
FIG. 6B is a view illustrating an example of an RF wire structure according to an embodiment of the disclosure.

FIG. 6B is a view illustrating an example of an RF wire structure according to an embodiment of the disclosure.

Referring to FIGS. 6A and 6B, the FPCB 500 (for example, a foldable FRC) may include at least one wire units 530, 540, 550, and 560, and an electromagnetic shield layer 570 (for example, an electromagnetic interference (EMI) film).

FIG. 6A illustrates that the FPCB 500 (for example, a foldable FRC) includes four wire units 530, 540, 550, and 560. However, this should not be considered as limiting, and the number of wire units 530, 540, 550, and 560 forming the FPCB 500 may be 1 to 3 or 5 or more according to an electronic device.

For example, an electromagnetic shield layer 570 (for example, an EMI film) may be disposed on an upper portion of the first wire unit 530. The electromagnetic shield layer 570 may include an EMI film conductive layer 571 and an EMI film insulation layer 572.

For example, the first wire unit 530 may include a first base film 531 (for example, a base polyimide (PI) film), a first metal layer 532, and a protection layer 533 (for example, a photo imageable solder resist (PSR)).

For example, the second wire unit 540 may include a second base film 541 (for example, a base PI film), a second metal layer 542, a coverlay adhesive layer 544, and a coverlay film 545 (for example, coverlay PI).

For example, an adhesive layer 543 (for example, a prepreg (PPG)) may be disposed between the first wire unit 530 and the second wire unit 540 to bond the first wire unit 530 and the second wire unit 540.

For example, the third wire unit 550 may include a third base film 551 (for example, a base PI film), a third metal layer 552, a coverlay adhesive layer 554, and a coverlay film 555 (for example, coverlay For example, an adhesive layer 546 (for example, a PPG) may be disposed between the second wire unit 540 and the third wire unit 550 to bond the second wire unit 540 and the third wire unit 550. An air gap 547 may be formed between the second base film 541 of the second wire unit 540 and the third base film 551 of the third wire unit 550.

For example, the fourth wire unit 560 may include a fourth base film 561 (for example, a base PI film), a fourth metal layer 562, a protection layer 563 (for example, a PSR), a coverlay adhesive layer 564, and a coverlay film 565 (for example, coverlay PI).

For example, an adhesive layer 553 (for example, a PPG) may be disposed between the third wire unit 550 and the fourth wire unit 560 to bond the third wire unit 550 and the fourth wire unit 560. An air gap 557 may be formed between the coverlay film 555 of the third wire unit 550 and the fourth base film 561 of the fourth wire unit 560.

Referring to FIG. 6B, the second metal layer 542 may include radio frequency (RF) signal wires 542a for transmitting RF signals, and ground wires 542b. Herein, the first metal layer (for example, the first metal layer 532 of FIG. 6A), the third metal layer (for example, the first metal layer 532 of FIG. 6A), the third metal layer (for example, the third metal layer 552 of FIG. 6A), and the fourth metal layer (for example, the fourth metal layer 562 of FIG. 6A) may include ground wires and signal wires. FIG. 6B illustrates that the RF signal wires 542a are formed in the second wire unit 540. However, this should not be considered as limiting, and the first metal layer 532, the third metal layer 552, and the fourth metal layer 562 may include RF signal wires (for example, the RF signal wires 542a) and ground wires (for example, the ground wires 542b).

Figure 7:
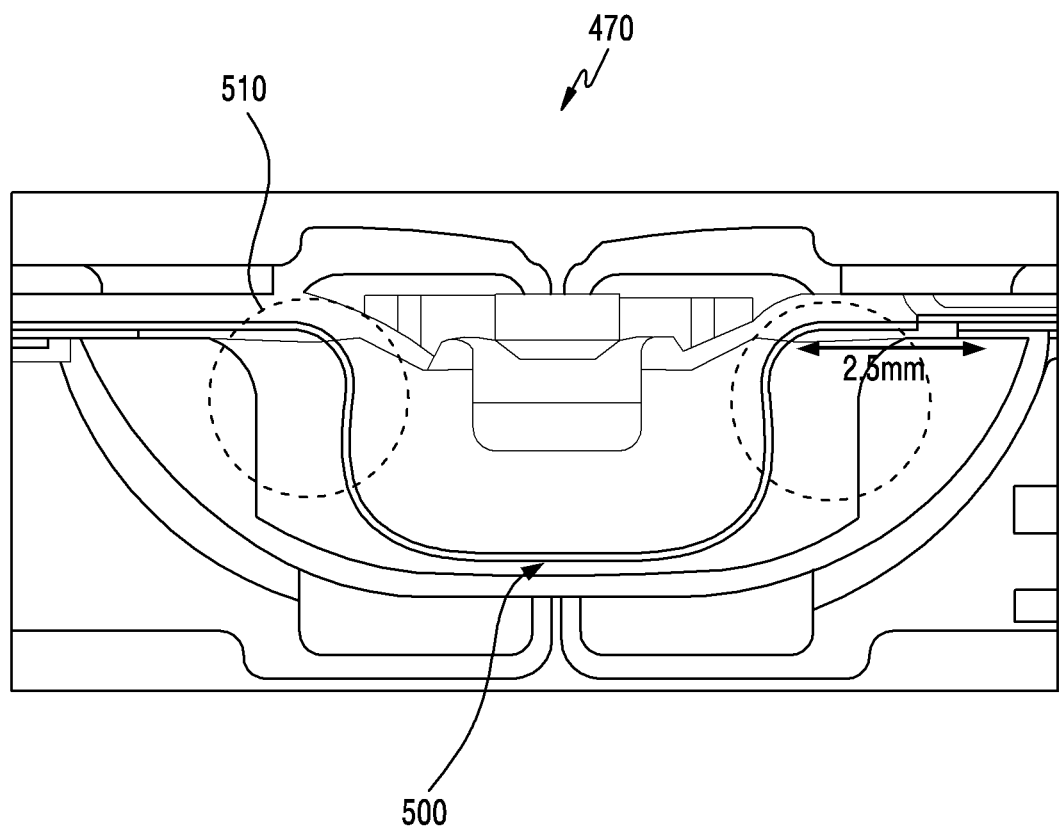
FIG. 7 is a view illustrating an example of a bending portion of an FPCB (for example, a foldable FRC) formed by folding and unfolding of a hinge structure of a foldable electronic device according to an embodiment of the disclosure.

FIG. 7 is a view illustrating an example of a bent portion of an FPCB (for example, a foldable FRC) formed by folding and unfolding of a hinge structure of a foldable electronic device according to an embodiment of the disclosure.

Referring to FIGS. 4 and 7, the electronic device 400 (for example, the electronic device 101 of FIG. 2) may be folded or unfolded through the hinge structure 470, and the bending portion 510 of the FPCB 500 may be bent (for example, folded or unfolded) when the electronic device 400 is folded or unfolded. Two bending portions 510 may be formed on the FPCB 500 when the electronic device 400 is folded or unfolded. The other portion except for the bending portions 510 may be formed as the non-bending portions 520.

The plurality of bending portions 510 and the plurality of non-bending portions (for example, the non-bending portions 520 of FIG. 5) may be formed to have different thicknesses in order to prevent a crack or fatigue fracture from occurring on the bending portions 510 of the FPCB 500 due to repetitive folding and unfolding of the electronic device 400.

For example, the plurality of bending portions 510 may be formed to have a first thickness, and the plurality of non-bending portions (for example, the non-bending portions 520 of FIG. 5) may be formed to have a second thickness which is thicker than the first thickness.

For example, a difference in thickness between the plurality of bending portions 510 and the plurality of non-bending portions (for example, the non-bending portions 520 of FIG. 5) may be made by adjusting a thickness of an insulation layer (for example, the coverlay adhesive layer 544).

Figure 8A:
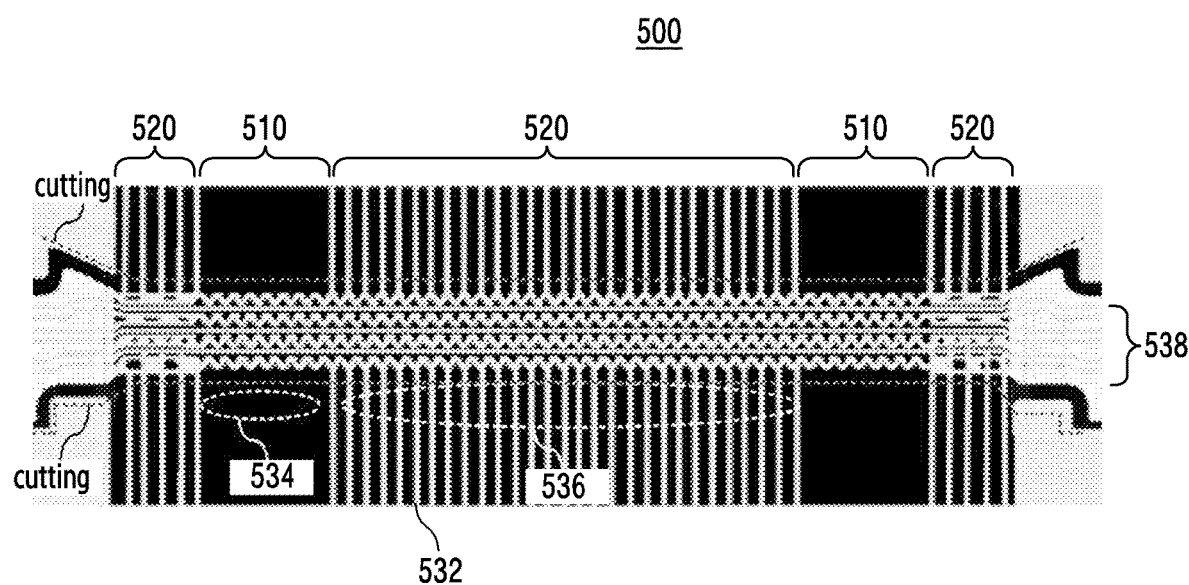
FIG. 8A is a view illustrating an example of forming resin tunnels to form different thicknesses of bending portions and non-bending portions of an FPCB (for example, a foldable FRC) according to an embodiment of the disclosure.

FIG. 8A is a view illustrating an example of forming resin tunnels to form different thicknesses of bending portions and non-bending portions of an FPCB (for example, a foldable FRC) according to an embodiment of the disclosure.

Figure 8B:
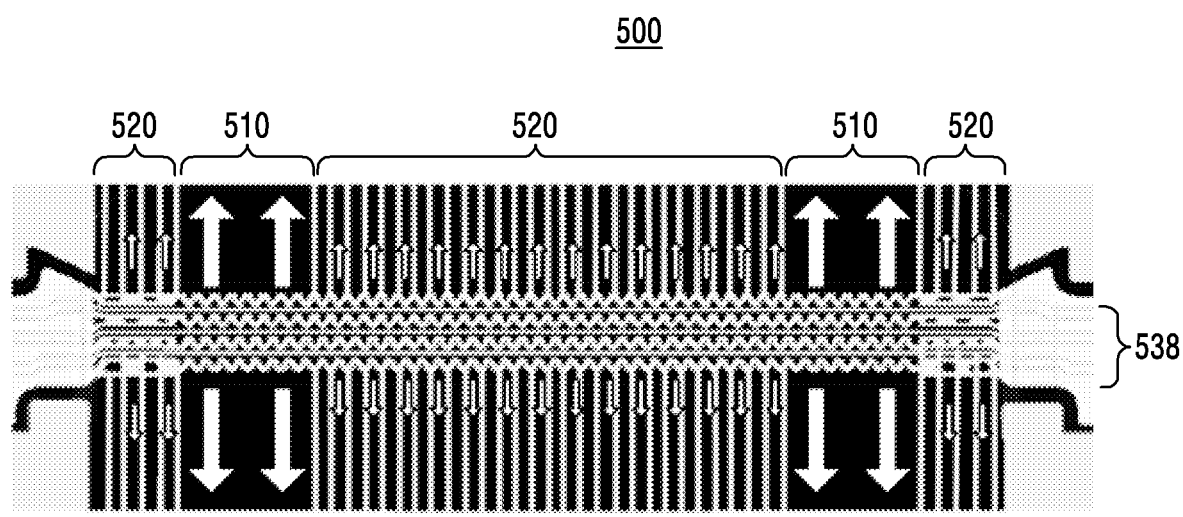
FIG. 8B is a view illustrating resin of a first amount discharged from bending portions by first resin tunnels, and resin of a second amount discharged from non-bending portions by second resin tunnels according to an embodiment of the disclosure.

FIG. 8B is a view illustrating resin of a first amount discharged from bending portions by first resin tunnels, and resin of a second amount discharged from non-bending portions by second resin tunnels according to an embodiment of the disclosure.

Referring to FIGS. 6A, 6B, 8A, and 8B, a thickness of an insulation layer (for example, the coverlay adhesive layer 544) formed to cover a metal layer (for example, the second metal layer 542) may be adjusted during a manufacturing process of the FPCB 500. For example, first resin tunnels 534 of a first width may be formed in the bending portion 510 by removing all copper foils 532 to make it easy to discharge resin of the coverlay adhesive layer 544. Second resin tunnels 536 of a second width which is narrower than the first width may be formed in the non-bending portions 520.

The first resin tunnels 534 may be formed to have substantially the same broad width as a width of the bending portion 510. The first resin tunnels 534 may be formed to be horizontally symmetric with reference to wires 538. The second resin tunnels 536 may be formed to have the second width narrower than the first width by removing some portions of the copper foils 532. The second resin tunnels 536 may be formed to be horizontally symmetric with reference to the wires 538.

For example, the resin of the first amount which is larger than an amount of resin discharged through the second resin tunnels 536 may be discharged from the bending portion 510 by the first resin tunnels 534. The resin of the second amount smaller than the amount of resin discharged through the first resin tunnels 534 may be discharged from the non-bending portions 520 by the second resin tunnels 536.

Figure 8C:
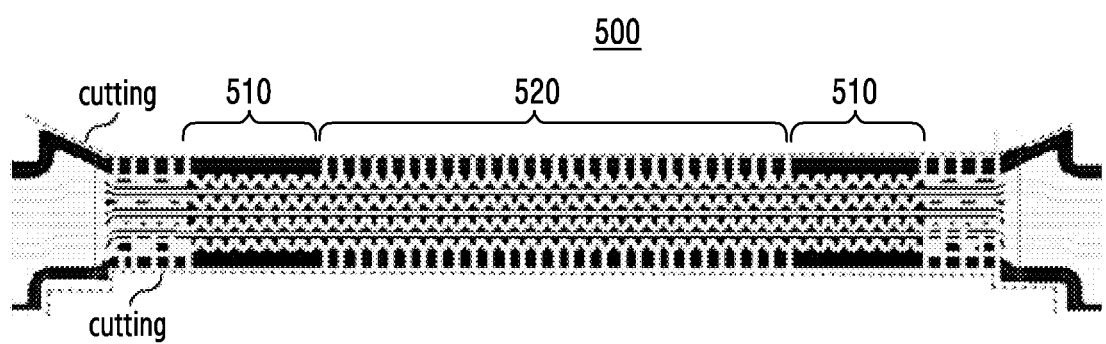
FIG. 8C is a view illustrating an example of an FPCB (for example, a foldable FRC) after a dummy portion is cut according to an embodiment of the disclosure.

FIG. 8C is a view illustrating an example of an FPCB (for example, a foldable FRC) after a dummy portion is cut according to an embodiment of the disclosure.

Referring to FIGS. 6A, 6B, and 8C, manufacturing of the FPCB 500 may be completed by attaching the electromagnetic shield layer 570 (for example, an EMI film) of the FPCB 500 and then cutting a dummy portion. Even after the dummy portion is cut, some of the first resin tunnels 534 and the second resin tunnels 536 may remain.

Figure 9:
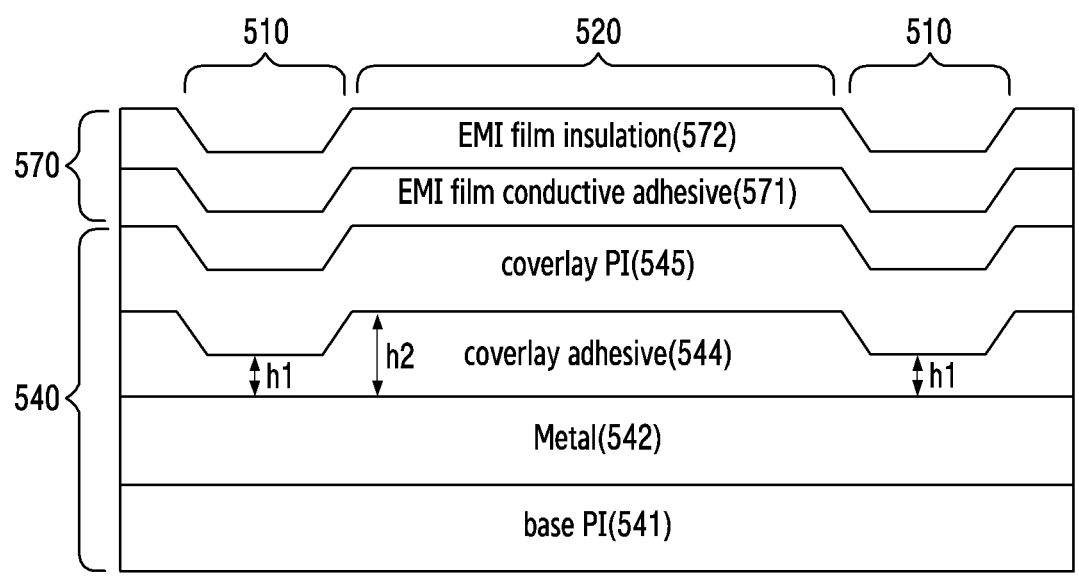
FIG. 9 is a view illustrating an example of bending portions and a non-bending portion which are formed to have different thicknesses according to an embodiment of the disclosure.

FIG. 9 is a view illustrating an example of bending portions and a non-bending portion which are formed to have different thicknesses according to an embodiment of the disclosure.

Referring to FIGS. 8A to 9, when pressure and heat are applied during a manufacturing process, about 30-50% of the resin applied to the bending portion 510 may be discharged by the first resin tunnels 534, and the coverlay adhesive layer 544 of the bending portion 510 may be formed to have a first thickness h1 (for example, 8.05 μm).

For example, when pressure and heat are applied during the manufacturing process, about 10-25% of the resin applied to the non-bending portions 520 may be discharged by the second resin tunnels 536, the coverlay adhesive layer 544 of the non-bending portions 520 may be formed to have a second thickness h2 (for example, 14.0 μm) which is thicker than the first thickness h1.

Herein, the amounts of resin discharged through the first resin tunnels 534 and the second resin tunnels 536 may be minutely adjusted according to concentration, viscosity, and/or pressure and temperature of resin forming the coverlay adhesive layer 544. Through this, the first thickness h1 of the coverlay adhesive layer 544 of the bending portion 510, and the second thickness h2 of the coverlay adhesive layer 544 of the non-bending portions 520 may be minutely adjusted.

As a thickness of an insulation layer (for example, the coverlay adhesive layer 544) increases, a conductor loss of an RF signal may be enhanced, but the lifespan of the FPCB 500 may be reduced due to a crack. As the thickness of the insulation layer (for example, the coverlay adhesive layer 544) decreases, the conductor loss of the RF signal may be degraded, but the crack may be prevented and the lifespan of the FPCB 500 may increase.

TABLE 1

|  | Bending portions 510 forming Resin tunnels | Non-bending portions 520 not forming Resin tunnels |
|---|---|---|
| Metal volume/resin tunnel area | Metal volume: 38.87% Resin tunnel area: 61.13% | Metal volume: 63.52% Resin tunnel area: 36.48% |
| Thickness of coverlay adhesive layer | 8.05-12.17 μm | 14.0-15.33 μm |

As shown in Table 1, the thickness of the coverlay adhesive layer 544 may be adjusted by adjusting areas of resin tunnels of the bending portions 510 and the non-bending portions 520.

When the first resin tunnels 534 having a first area (for example, 61.13%) against an area of the bending portion 510 are formed, an amount of resign larger than an amount of resin discharged by the second resin tunnels 536 may be discharged during a manufacturing process, and the coverlay adhesive layer 544 may be formed to have the first thickness h1 (for example, thinner than the second thickness h2). When the second resin tunnels 536 having a second area (36.48%) against an area of the non-bending portions 520 are formed, an amount of resin smaller than the amount of resin discharged by the first resin tunnels 534 may be discharged during the manufacturing process, and the coverlay adhesive layer 544 may be formed to have the second thickness h2 (for example, thicker than the first thickness h1). A thickness of the bending portion 510 of the FPCB 500 may decrease as much as the thickness h1 of the coverlay adhesive layer 544 decreases. However, this should not be considered as limiting, and an amount of discharged resin may be adjusted when the protection layer 533 of the first wire unit 530, the coverlay adhesive layer 554 of the third wire unit 550, and/or the coverlay adhesive layer 564 of the fourth wire unit 560 is formed. Not only the thickness of the coverlay adhesive layer 544 of the second wire unit 540, but also thickness of the protection layer 533 of the first wire unit (for example, the first wire unit 530 of FIG. 6A), the coverlay adhesive layer 544 of the third wire unit (for example, the third wire unit 550 of FIG. 6A), and/or the coverlay adhesive layer 564 of the fourth wire unit (for example, the fourth wire unit 560 of FIG. 6A), which corresponds to the first bending portion 510, may be formed to be thin against the non-bending portions 520. For example, the protection layer 533 of the first wire unit 530, the coverlay adhesive layer 544 of the second wire unit 540, the coverlay adhesive layer 554 of the third wire unit 550, and/or the coverlay adhesive layer 564 of the fourth wire unit 560, which corresponds to the bending portion 510, may be formed to have the first thickness, and a portion corresponding to the non-bending portions 520 may be formed to have the second thickness thicker than the first thickness. Through this, the thickness of the bending portion 510 of the FPCB 500 may decrease as much as the thickness of the insulation layer of the first wire unit 530, the second wire unit 540, the third wire unit 550, and/or the fourth wire unit 560 decreases.

When the bending portion 510 of the FPCB 500 is formed to be thinner than the non-bending portions 520, a possibility of occurrence of a crack and fatigue fracture on the bending portion 510 when the electronic device 400 is folded and unfolded can be reduced, and the lifespan of the FPCB 500 can be extended.

Figure 10A:
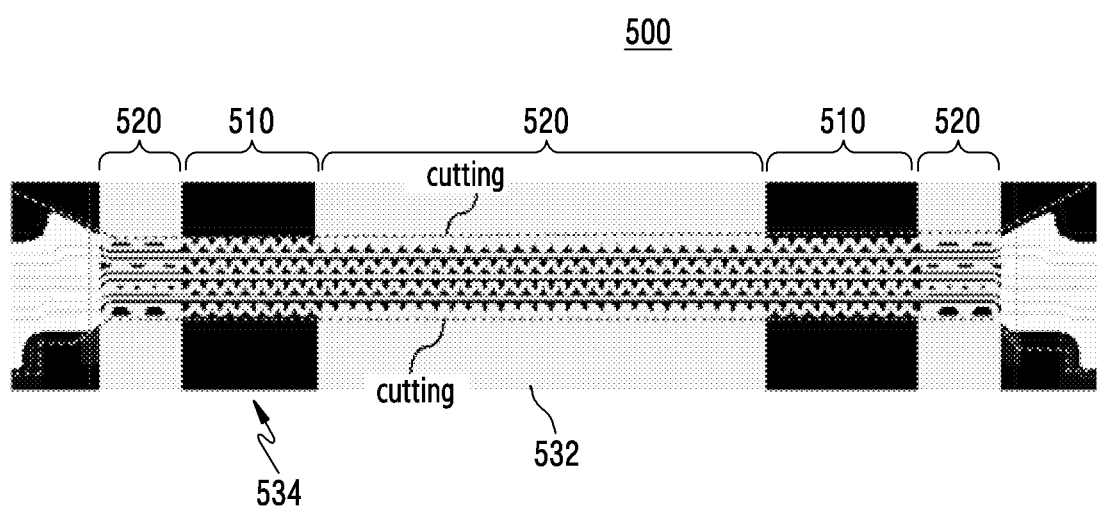
FIG. 10A is a view illustrating an example of forming resin tunnels to form different thicknesses of bending portions and non-bending portions of an FPCB (for example, a foldable FRC) according to an embodiment of the disclosure.

FIG. 10A is a view illustrating an example of forming resin tunnels to form different thicknesses of bending portions and non-bending portions of an FPCB (for example, a foldable FRC) according to an embodiment of the disclosure.

Figure 10B:
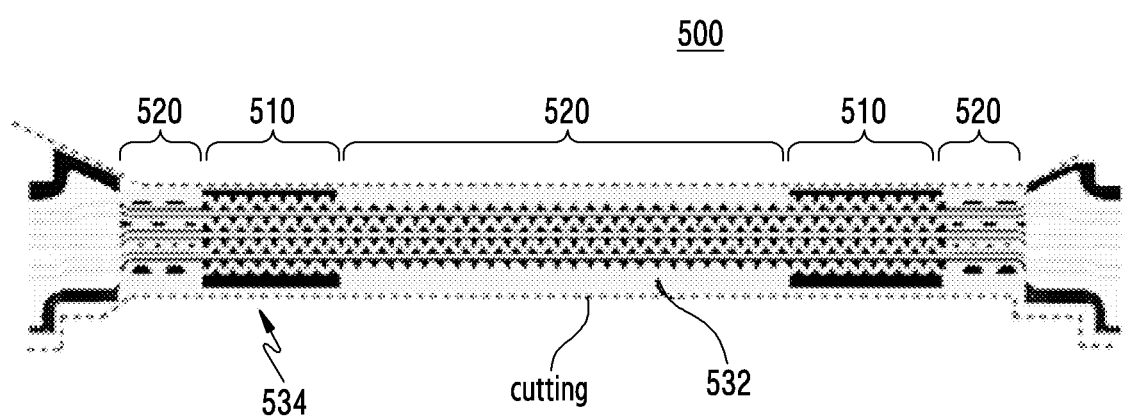
FIG. 10B is a view illustrating an example of an FPCB (for example, a foldable FRC) after a dummy portion is cut according to an embodiment of the disclosure.

FIG. 10B is a view illustrating an example of an FPCB (for example, a foldable FRC) after a dummy portion is cut according to an embodiment of the disclosure.

Referring to FIGS. 6A, 6B, 10A, and 10B, a thickness of an insulation layer (for example, the coverlay adhesive layer 544) formed to cover a metal layer (for example, the second metal layer 542) may be adjusted during a manufacturing process of the FPCB 500.

For example, first resin tunnels 534 of a first width may be formed in the bending portion 510 by removing all of copper foils 532 to make it easy to discharge resin of the coverlay adhesive layer 544. The first resin tunnels 534 may be formed with substantially the same broad width as a width of the bending portion 510. The coverlay adhesive layer 544 may be formed on the non-bending portions 520 as it is without removing the copper foils 532.

Manufacturing of the FPCB 500 may be completed by attaching the electromagnetic shield layer 570 (for example, an EMI film) of the FPCB 500 and then cutting a dummy portion. Even after the dummy portion is cut, some of the first resin tunnels 534 may remain.

When pressure and heat are applied during a manufacturing process, about 30-50% of the resin applied to the bending portion 510 may be discharged by the first resin tunnels 534, and the coverlay adhesive layer 544 of the bending portion 510 may be formed to have the first thickness h1 (see FIG. 9).

For example, when pressure and heat are applied during the manufacturing process, about 5-20% of the resin applied to the non-bending portions 520 may be discharged, and the coverlay adhesive layer 544 of the non-bending portions 520 may be formed to have the second thickness h2 (see FIG. 9) which is thicker than the first thickness.

Herein, the first thickness h1 of the coverlay adhesive layer 544 of the bending portion 510 and the second thickness h2 of the coverlay adhesive layer 544 of the non-bending portions 520 may be minutely adjusted according to concentration, viscosity, and pressure and temperature of resin forming the coverlay adhesive layer 544.

When the bending portion 510 of the FPCB 500 is formed to be thinner than the non-bending portions 520 as described above, a possibility of occurrence of a crack and fatigue fracture on the bending portion 510 when the electronic device 400 is folded and unfolded can be reduced, and the lifespan of the FPCB 500 can be extended.

Figure 11:
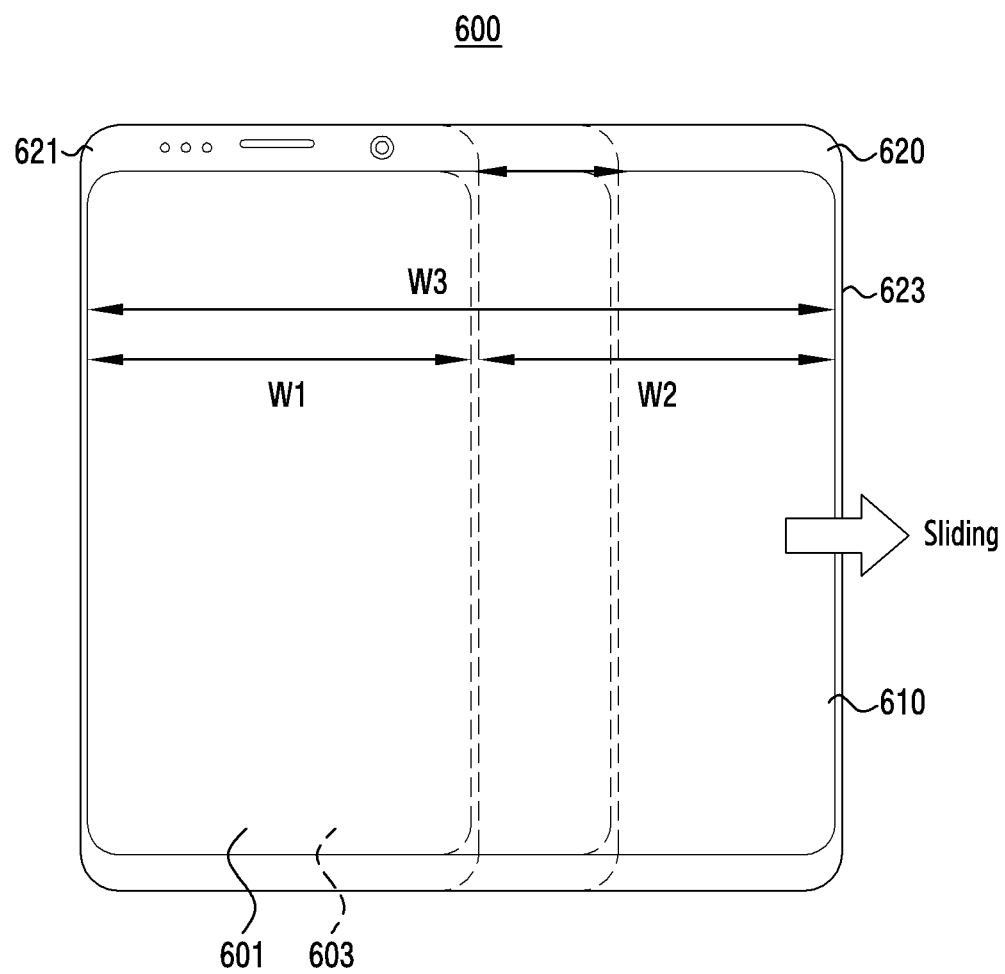
FIG. 11 is a view illustrating an electronic device having a display extended and reduced according to various embodiments of the disclosure according to an embodiment of the disclosure.

FIG. 11 is a view illustrating an example of an electronic device having a display extended and reduced according to an embodiment of the disclosure.

Referring to FIG. 11, an electronic device 600 (for example, the electronic device 101 of FIG. 1) according to an embodiment of the disclosure may include a first plate 601 facing in a first direction (for example, a front surface), and a second plate 603 facing in a second direction (for example, a rear surface) which is opposite to the first direction. The electronic device 600 may include a back cover 620, and housings 621 and 623 forming a space between the first plate 601 and the second plate 603, and/or a flexible display 610 (for example, the display module 160 of FIG. 1) exposed through the first plate 601.

According to an embodiment, the electronic device 600 may include a first housing 621 and a second housing 623.

According to an embodiment, the first housing 621 may be formed to be fixed, and the second housing 623 may be formed to be movable in a sliding manner. For example, the second housing 623 may be formed to be slidable in one side direction of the first housing 621. According to an embodiment, the second housing 623 may be moved by a second width W2 to the maximum in one side direction of the first housing 621.

According to an embodiment, the display 610 may be flexible, and a width of a region of the display 610 exposed to the outside may be adjusted based on a movement of the second housing 623. For example, the display 610 may normally have at least a portion exposed to have a first width W1. When the second housing 623 moves in a sliding manner, the other portion of the display 610 may be further extended by the second width W2 to the maximum and may be exposed.

According to an embodiment, a state in which the display 610 does not slide and is exposed by the first width W1 may be defined as a slide close state (for example, a display reduction state). A state in which the display 610 slides and is exposed by a third width W3 may be defined as a slide open state (for example, a display extension state). For example, the second width W2 added to the first width W1 may equal the third width W3.

Figure 12A:
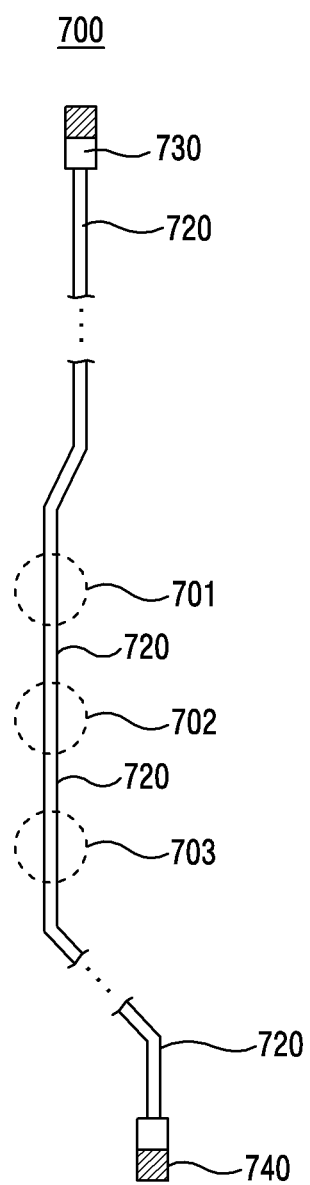
FIG. 12A is a view illustrating an example of an FPCB (for example, a foldable FRC) applied to a slidable electronic device according to an embodiment of the disclosure.

FIG. 12A is a view illustrating an example of an FPCB (for example, a foldable FRC) applied to a slidable electronic device according to an embodiment of the disclosure.

Figure 12B:
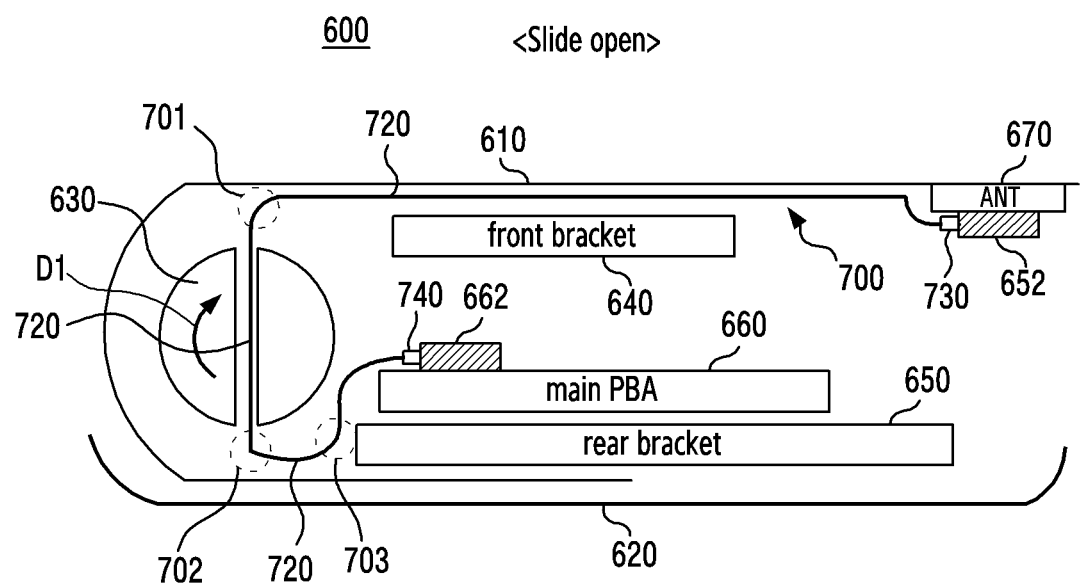
FIG. 12B is a view illustrating an example of bending portions of an FPCB (for example, a foldable FRC) formed by rotation of a hinge structure of a slidable electronic device according to an embodiment of the disclosure.

FIG. 12B is a view illustrating an example of bending portions of an FPCB (for example, the foldable FRC) formed by rotation of a hinge structure of a slidable electronic device according to an embodiment of the disclosure.

Figure 12C:
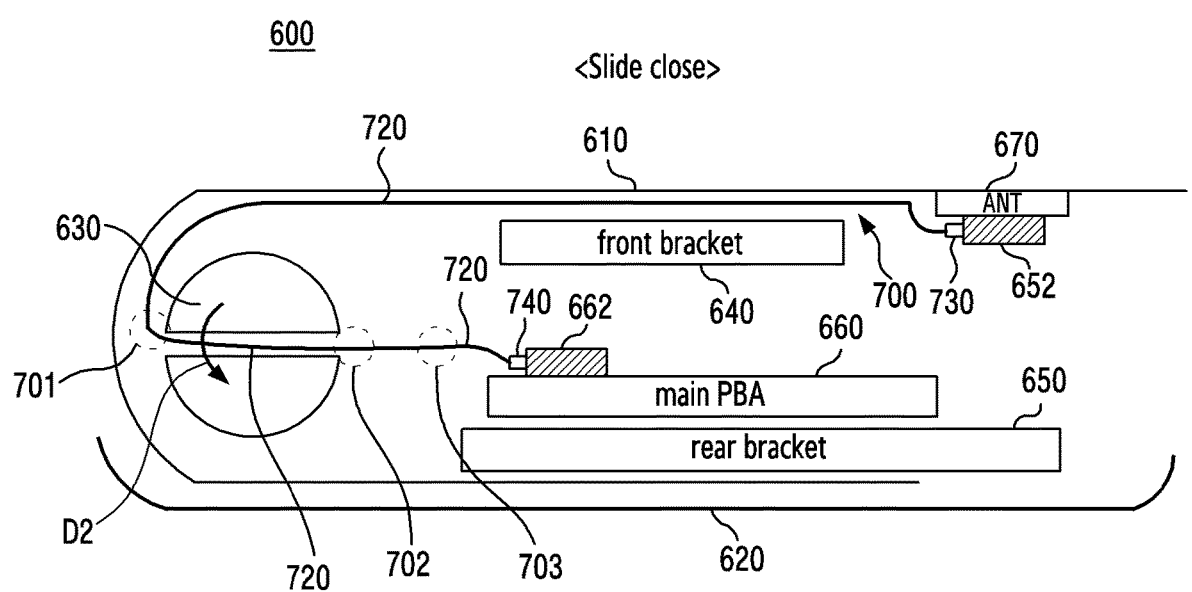
FIG. 12C is another view illustrating an example of bending portions of an FPCB (for example, a foldable FRC) formed by rotation of a hinge structure of a slidable electronic device according to an embodiment of the disclosure.

FIG. 12C is another view illustrating an example of bending portions of an FPCB (for example, the foldable FRC) formed by rotation of a hinge structure of a slidable electronic device according to an embodiment of the disclosure.

Referring to FIGS. 12A, 12B, and 12C, an FPCB 700 (for example, a foldable FRC) may be applied to the electronic device 600 (for example, a slidable electronic device). The FPCB 700 may include a first connector 730, a second connector 740, and wire units 701, 702, 703, and 720. The wire units 701, 702, 703, and 720 may include a plurality of bending portions 701, 702, and 703 which are bent when the flexible display 610 of the electronic device 600 is extended and reduced, and non-bending portions 720 which are not bent. For example, the FPCB 700 may include the plurality of bending portions 701, 702, and 703 corresponding to positions which are bent according to rotation of a hinge structure 630 of the electronic device 600. The FPCB 700 may be formed to be about 70-90 μm thick, but embodiments are not limited thereto.

The electronic device 600 may include the flexible display 610, the back cover 620, the hinge structure 630, a front bracket 640, a rear bracket 650, a main PBA 660, an antenna module 670, and the FPCB (for example, an FRC).

The first connector 730 of the FPCB 700 may be electrically connected with a connector 652 connected with the antenna module 670. The second connector 740 of the FPCB 700 may be electrically connected with a connector 662 of the main PBA 660.

For example, when the electronic device 600 is in a slide open state, the hinge structure 630 may be rotated in a first direction (for example, a first direction D1 of FIG. 12B) and the flexible display 610 may be extended. For example, when the electronic device 600 is in a slide close state, the hinge structure 630 may be rotated in a second direction (for example, a second direction D2 of FIG. 12C) and the flexible display 610 may be reduced. While the hinge structure 630 is rotated in the first direction D1 or the second direction D2, the electronic device 600 may have the flexible display 610 slide and the screen extended or reduced.

Due to the rotation of the hinge structure 630 of the flexible display 610, the bending portions 701, 702, and 703 of the FPCB 700 may be bent (folded or unfolded). When the screen of the electronic device 600 is extended or reduced, the plurality of bending portions 701, 702, and 703 (for example, three bending portions) may be formed on the FPCB 700. FIGS. 12A, 12B, and 12C illustrate that the FPCB 700 may include three bending portions 701, 702, and 703, but this should not be considered as limiting. The number of bending portions 701, 702, and 703 may be changed according to a structure of the electronic device 600.

The plurality of bending portions 701, 702, and 703 and the plurality of non-bending portions 720 may be formed to have different thicknesses in order to prevent a crack or fatigue fracture from occurring on the plurality of bending portions 701, 702, and 703 of the FPCB 700 due to repetitive slide open/close of the electronic device 600.

For example, the plurality of bending portions 701, 702, and 703 may be formed to have a first thickness, and the plurality of non-bending portions 720 may be formed to have a second thickness which is thicker than the first thickness.

For example, a difference in thickness between the plurality of bending portions 701, 702, and 703 and the plurality of non-bending portions 720 may be made by adjusting a thickness of an insulation layer (for example, the coverlay adhesive layer 544 of FIG. 9). For example, an insulation layer (for example, the coverlay adhesive layer 544 of FIG. 9) of a portion corresponding to the plurality of bending portions 701, 702, and 703 may be formed to have the first thickness (for example, h1 of FIG. 9). An insulation layer (for example, the coverlay adhesive layer 544 of FIG. 9) of a portion corresponding to the plurality of non-bending portions 720 may be formed to have the second thickness (for example, h2 of FIG. 9).

Figure 13:
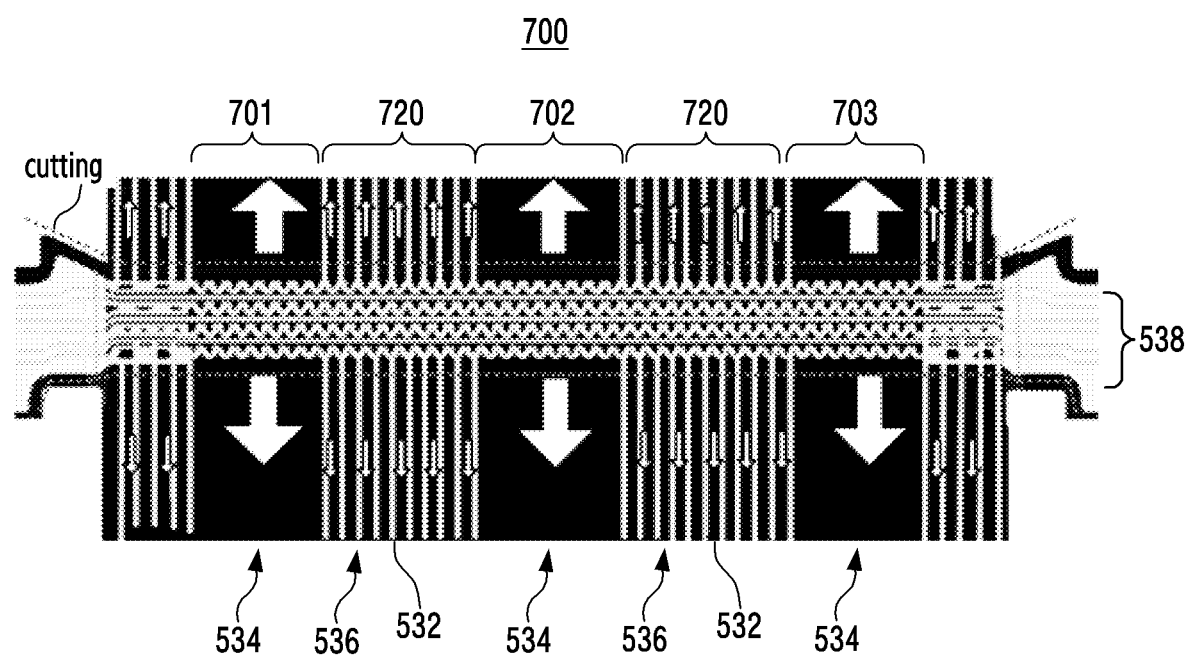
FIG. 13 is a view illustrating an example of forming resin tunnels to form different thicknesses of bending portions and non-bending portions of an FPCB (for example, a foldable FRC) according to an embodiment of the disclosure.

FIG. 13 is a view illustrating an example of forming resin tunnels to form different thicknesses of bending portions and non-bending portions of an FPCB (for example, a foldable FRC) according to an embodiment of the disclosure.

Referring to FIGS. 9 and 13, a thickness of an insulation layer (for example, the coverlay adhesive layer 544) formed to cover a metal layer (for example, the second metal layer 542) may be adjusted during a manufacturing process of the FPCB 700.

For example, first tunnels 534 of a first width may be formed in the plurality of bending portions 701, 702, and 703 by removing all of copper foils 532 to make it easy to discharge resin of the coverlay adhesive layer 544. The first resin tunnels 534 may be formed to be horizontally symmetric with reference to wires 538. The second resin tunnels 536 of a second width narrower than the first width may be formed in the plurality of non-bending portions 720. The second resin tunnels 536 may be formed to have the second width narrower than the first width by removing some of the copper foils 532. The second resin tunnels 536 may be formed to be horizontally symmetric with reference to the wires 538.

The first resin tunnels 534 may be formed to have substantially the same broad width as a width of the bending portion 701, 702, and 703. The second resin tunnels 536 may be formed to have the second width narrower than the first width by removing some of the copper foils 532.

When pressure and heat are applied during a manufacturing process, about 30-50% of the resin applied to the bending portions 701, 702, and 703 may be discharged by the first resin tunnels 534, and the coverlay adhesive layer 544 of the bending portion 510 may be formed to have the first thickness h1.

For example, when pressure and heat are applied during the manufacturing process, about 10-25% of the resin applied to the non-bending portion 720 may be discharged by the second resin tunnels 536, and the coverlay adhesive layer 544 of the non-bending portion 720 may be formed to have the second thickness h2 which is thicker than the first thickness h1.

Herein, the first thickness h1 of the coverlay adhesive layer 544 of the bending portion 701, 702, and 703 and the second thickness h2 of the coverlay adhesive layer 544 of the non-bending portion 720 may be minutely adjusted according to concentration, viscosity, and pressure and temperature of resin forming the coverlay adhesive layer 544.

When the bending portion 701, 702, and 703 of the FPCB 700 is formed to be thinner than the non-bending portion 720 as described above, a possibility of occurrence of a crack and fatigue fracture on the bending portion 701, 702, and 703 when the electronic device 600 slides open or close can be reduced, and the lifespan of the FPCB 700 can be extended.

According to various embodiments of the disclosure, an FPCB 500 and 700 of an electronic device 101, 400, and 600 including a flexible display 200 and 610 (for example, the display module 160) having a shape deformed by a hinge structure 470 and 630, the FPCB 500 and 700 may include a plurality of bending portions 510, 701, 702, and 703 which are bent according to a deformation of a shape of the electronic device 101, 400, and 600, and a plurality of non-bending portions 520 and 720 which are positioned on the periphery of the plurality of bending portions 510, 701, 702, and 703. The plurality of bending portions 510, 701, 702, and 703 and the plurality of non-bending portions 520 and 720 may be to have different thicknesses.

According to various embodiments of the disclosure, the plurality of bending portions 510, 701, 702, and 703 of the FPCB 500 and 700 may be formed to have a first thickness.

The plurality of non-bending portions 520 and 720 may be formed to have a second thickness which is thicker than the first thickness.

According to various embodiments of the disclosure, the FPCB 500 and 700 may include an electromagnetic shield layer 570 and at least one wire unit 530, 540, 550, and 560. The at least one wire unit 530, 540, 550, and 560 may include a base film 531, 541, 551, and 561, a metal layer 532, 542, 552, and 562 on the base film 531, 541, 551, and 561, and an insulation layer (for example, the coverlay adhesive layer 544, 554, 564, and the protection layer 533) on the metal layer 532, 542, 552, and 562. The insulation layer (for example, the coverlay adhesive layer 544, 554, 564, and the protection layer 533) may be formed to have a first thickness h1 on the bending portions 510, 701, 702, and 703, and may be formed to have a second thickness h2 thicker than the first thickness h1 on the non-bending portions 520 and 720.

According to various embodiments of the disclosure, the insulation layer (for example, the coverlay adhesive layer 544, 554, 564, and the protection layer 533) of the FPCB 500 and 700 may include a coverlay adhesive layer 544, 554, and 564.

According to various embodiments of the disclosure, the metal layer 532, 542, 552, and 562 of the FPCB 500 and 700 may include RF signal wires 542*a* and ground wires 542*b*.

According to various embodiments of the disclosure, a plurality of first resin tunnels 534 having a first width may be formed in the plurality of bending portions 510, 701, 702, and 703 of the FPCB 500 and 700 by removing a copper foil 542.

According to various embodiments of the disclosure, a plurality of second resin tunnels 536 may be formed in the plurality of non-bending portions 520 and 720 of the FPCB 500 and 700 by controlling a portion of the copper foil 542. The plurality of second resin tunnels 536 may have a second width which is narrower than the first width.

According to various embodiments of the disclosure, the copper foil 542 may be disposed in the plurality of non-bending portions 520 and 720 of the FPCB 500, 700.

According to various embodiments of the disclosure, the plurality of bending portions 510 of the FPCB 500 and 700 may be formed on a portion that is bent according to folding and unfolding of the flexible display 200 and 610 (for example, the display module 160).

According to various embodiments of the disclosure, the plurality of bending portions 701, 702, and 703 of the FPCB 500 and 700 may be formed on a portion that is bent according to whether the flexible display 200 and 610 (for example, the display module 160) slides open and close.

According to various embodiments of the disclosure, an electronic device 101, 400, and 600 may include a hinge structure 470 and 630, a flexible display 200 and 610 (for example, the display module 160) having a shape deformed by the hinge structure 470 and 630, and an FPCB 500 and 700. The FPCB 500, 700 may include a plurality of bending portions 510, 701, 702, and 703 which are bent according to a deformation of a shape of the electronic device 101, 400, and 600, and a plurality of non-bending portions 520 and 720 which are positioned on the periphery of the plurality of bending portions 510, 701, 702, and 703. The plurality of bending portions 510, 701, 702, and 703 and the plurality of non-bending portions 520 and 720 may be formed to have different thicknesses.

According to various embodiments of the disclosure, in the electronic device 101, 400, and 600, the plurality of bending portions 510, 701, 702, and 703 of the FPCB 500 and 700 may be formed to have a first thickness. The plurality of non-bending portions 520 and 720 may be formed to have a second thickness which is thicker than the first thickness.

According to various embodiments of the disclosure, in the electronic device 101, 400, and 600, the FPCB 500 and 700 may include an electromagnetic shield layer 570 and at least one wire unit 530, 540, 550, and 560. The at least one wire unit 530, 540, 550, and 560 may include a base film 531, 541, 551, and 561, a metal layer 532, 542, 552, and 562 on the base film layer 531, 541, 551, and 561, and an insulation layer (for example, the coverlay adhesive layer 544, 554, and 564 on the metal layer 532, 542, 552, and 562. The insulation layer (for example, the coverlay adhesive layer 544, 554, 564, and the protection layer 533) may be formed to have a first thickness h1 in the bending portions 510, 701, 702, and 703, and may be formed to have a second thickness h2 which is thicker than the first thickness h1 in the non-bending portions 520 and 720.

According to various embodiments of the disclosure, in the electronic device 101, 400, and 600, the insulation layer (for example, the coverlay adhesive layer 544, 554, and 564, the protection layer 533) of the FPCB 500 and 700 may include a coverlay adhesive layer 544, 554, and 564.

According to various embodiments of the disclosure, in the electronic device 101, 400, and 600, the metal layer 532, 542, 552, and 562 may include RF signal wires 542*a* and ground wires 542*b*.

According to various embodiments of the disclosure, in the electronic device 101, 400, and 600, a plurality of first resin tunnels 534 having a first width may be formed in the plurality of bending portions 510, 701, 702, and 703 of the FPCB 500 and 700 by removing a copper foil 542.

According to various embodiments of the disclosure, in the electronic device 101, 400, and 600, a plurality of second resin tunnels 536 may be formed in the plurality of non-bending portions 520 and 720 by controlling a portion of the copper foil 542. The plurality of second resin tunnels 536 may have a second width which is narrower than the first width.

According to various embodiments of the disclosure, in the electronic device 101, 400, and 600, the copper foil 542 may be disposed in the plurality of non-bending portions 520 and 720 of the FPCB 500, 700.

According to various embodiments of the disclosure, in the electronic device 101, 400, and 600, the plurality of bending portions 510, 701, 702, and 703 may be formed on a portion that is bent according to folding and unfolding of the flexible display 200 and 610 (for example, the display module 160).

According to various embodiments of the disclosure, in the electronic device 101, 400, and 600, the plurality of bending portions 510, 701, 702, and 703 may be formed on a portion that is bent according to whether the flexible display 200 and 610 (for example, the display module 160) slides open and close.

According to various embodiments of the disclosure, an FPCB (for example, an FRC) which is not damaged by repetitive folding and unfolding of a foldable electronic device, and can maintain a long lifespan, and an electronic device including the same are provided. In addition, an FPCB (for example, an FRC) which is not damaged by repetitive extension and reduction of a screen of a slidable electronic device, and can maintain a long lifespan, and an electronic device including the same are provided.

Various other effects that can be directly or indirectly understood through the disclosure may be provided.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and detail may be made therein without departing from the spirit and scope of the disclosure as defined by the appended claims and their equivalents.

The invention claimed is:

1. A flexible printed circuit board (FPCB) of an electronic device comprising a flexible display having a shape deformed by a hinge structure, the FPCB comprising:
    a bending portion which is bent according to a deformation of the shape of the electronic device; and
    a non-bending portion which extends from the bending portion,
    wherein the bending portion and the non-bending portion are formed to have different thicknesses,
    wherein an insulation layer is formed to have a first thickness in the bending portion, and
    wherein the insulation layer is formed to have a second thickness thicker than the first thickness in the non-bending portion.

2. The FPCB of claim 1,
    wherein the bending portion is formed to have a first portion thickness, and
    wherein the non-bending portion is formed to have a second portion thickness thicker than the first portion thickness.

3. The FPCB of claim 1, further comprising:
    an electromagnetic shield layer and at least one wire unit,
    wherein the at least one wire unit comprises a base film, a metal layer on the base film, and the insulation layer on the metal layer.

4. The FPCB of claim 3, wherein the insulation layer comprises a coverlay adhesive layer.

5. The FPCB of claim 3, wherein the metal layer comprises radio frequency (RF) signal wires and ground wires.

6. The FPCB of claim 1, wherein a first resin tunnel having a first width is formed in the bending portion by removing a copper foil.

7. The FPCB of claim 6,
wherein a second resin tunnel is formed in the non-bending portion by controlling a portion of the copper foil, and
wherein the second resin tunnel has a second width narrower than the first width.

8. The FPCB of claim 6, wherein the copper foil is disposed in the non-bending portion.

9. The FPCB of claim 1, wherein the bending portion is formed on a portion that is bent according to folding and unfolding of the flexible display.

10. The FPCB of claim 1, wherein the bending portion is formed on a portion that is bent according to whether the flexible display slides open or closed.

11. An electronic device comprising:
a hinge structure;
a flexible display having a shape deformed by the hinge structure; and
a flexible printed circuit board (FPCB),
wherein the FPCB comprises:
a bending portion which is bent according to a deformation of a shape of the electronic device, and
a non-bending portion which extends from the bending portion,
wherein the bending portion and the non-bending portion are formed to have different thicknesses,
wherein an insulation layer is formed to have a first thickness in the bending portion, and
wherein the insulation layer is formed to have a second thickness thicker than the first thickness in the non-bending portion.

12. The electronic device of claim 11,
wherein the bending portion of the FPCB is formed to have a first portion thickness, and
wherein the non-bending portion is formed to have a second portion thickness thicker than the first portion thickness.

13. The electronic device of claim 11,
wherein the FPCB comprises an electromagnetic shield layer and at least one wire unit,
wherein the at least one wire unit comprises a base film, a metal layer on the base film, and the insulation layer on the metal layer.

14. The electronic device of claim 13, wherein the insulation layer of the FPCB comprises a coverlay adhesive layer.

15. The electronic device of claim 13, wherein the metal layer comprises radio frequency (RF) signal wires and ground wires.

16. The electronic device of claim 11, wherein a first resin tunnel having a first width is formed in the bending portion of the FPCB by removing a copper foil.

17. The electronic device of claim 16,
wherein a second resin tunnel is formed in the non-bending portion by controlling a portion of the copper foil, and
wherein the second resin tunnel has a second width narrower than the first width.

18. The electronic device of claim 16, wherein the copper foil is disposed in the non-bending portion.

19. The electronic device of claim 11, wherein the bending portion is formed on a portion that is bent according to folding and unfolding of the flexible display.

20. The electronic device of claim 11, wherein the bending portion is formed on a portion that is bent according to whether the flexible display slides open or closed.

* * * * *